(12) United States Patent
Drebinger et al.

(10) Patent No.: US 9,671,805 B2
(45) Date of Patent: Jun. 6, 2017

(54) LINEAR VOLTAGE REGULATOR UTILIZING A LARGE RANGE OF BYPASS-CAPACITANCE

(71) Applicant: Dialog Semiconductor GmbH, Kirchheim/Teck-Nabern (DE)

(72) Inventors: Stephan Drebinger, Munich (DE); Roberto Curra, Groebenzell (DE)

(73) Assignee: Dialog Semiconductor (UK) Limited, London (GB)

( * ) Notice: Subject to any disclaimer, the term of this patent is extended or adjusted under 35 U.S.C. 154(b) by 105 days.

(21) Appl. No.: 14/632,345

(22) Filed: Feb. 26, 2015

(65) Prior Publication Data
US 2015/0355653 A1 Dec. 10, 2015

(30) Foreign Application Priority Data
Jun. 4, 2014 (EP) .................................... 14171088

(51) Int. Cl.
*G05F 1/575* (2006.01)
*H03F 3/34* (2006.01)
*H03F 3/45* (2006.01)

(52) U.S. Cl.
CPC ............... *G05F 1/575* (2013.01); *H03F 3/34* (2013.01); *H03F 3/45183* (2013.01);
(Continued)

(58) Field of Classification Search
CPC ... G05F 1/10; G05F 1/445; G05F 1/46; G05F 1/461; G05F 1/561; G05F 1/562;
(Continued)

(56) References Cited

U.S. PATENT DOCUMENTS

2003/0214275 A1  11/2003  Biagi
2004/0104711 A1  6/2004  Scoones et al.
(Continued)

OTHER PUBLICATIONS

European Search Report 14171088.9-1807, Jan. 8, 2015, Dialog Semiconductor (UK) Ltd.

*Primary Examiner* — Gustavo Rosario Benitez
*Assistant Examiner* — Carlos Rivera-Perez
(74) *Attorney, Agent, or Firm* — Saile Ackerman LLC; Stephen B. Ackerman

(57) ABSTRACT

Amplifiers, notably multi-stage amplifiers, such as linear regulators (e.g. low-dropout regulators) configured to provide a constant output voltage subject to load transients are presented. An amplifier is described, which comprises a first amplification stage configured to provide an intermediate voltage, based on an outer feedback voltage and based on a reference voltage. Furthermore, the amplifier comprises an output stage configured to provide a load current at an output voltage based on the intermediate voltage. In addition, the amplifier comprises an outer feedback circuit configured to derive the outer feedback voltage from the output voltage. The output stage comprises a buffer configured to provide a drive voltage based on the intermediate voltage and based on an inner feedback voltage derived from the output voltage. The buffer comprises a pass device which is configured to provide the load current at the output voltage based on the drive voltage.

26 Claims, 9 Drawing Sheets

(52) U.S. Cl.
CPC .................. *H03F 2200/297* (2013.01); *H03F 2203/45301* (2013.01); *H03F 2203/45674* (2013.01)

(58) Field of Classification Search
CPC .......... G05F 1/563; G05F 1/565; G05F 1/569; G05F 1/571; G05F 1/575; G05F 1/56; G05F 1/573; G05F 1/5735; G05F 3/03; G05F 3/08; G05F 3/10; G05F 3/16; G05F 3/20; G05F 3/22; G05F 3/26; G05F 3/24; G05F 3/30; G05F 3/262; G05F 3/265; G05F 3/267; H02M 3/156; H02M 3/158; H02M 2003/1566; H02M 2001/0025; H03F 3/34; H03F 3/45; H03F 3/45071; H03F 3/45076; H03F 3/45179; H03F 3/45183; H03F 3/45192; H03F 3/45188; H03F 2200/297; H03F 2203/45301; H03F 2203/45674

USPC ........ 323/222–226, 266–285, 303, 311–317, 323/351; 327/538–543; 330/252, 253, 330/254, 257, 259, 260, 288, 291–294, 330/310, 98–100; 361/18

See application file for complete search history.

(56) References Cited

U.S. PATENT DOCUMENTS

| | | |
|---|---|---|
| 2005/0040807 A1* | 2/2005 | Chen ...................... G05F 1/575 323/315 |
| 2006/0132240 A1 | 6/2006 | Tu |
| 2008/0218137 A1 | 9/2008 | Okuyama et al. |
| 2009/0322429 A1* | 12/2009 | Ivanov ................ H03F 3/45179 330/257 |
| 2010/0164451 A1 | 7/2010 | Cerchi et al. |
| 2012/0182167 A1 | 7/2012 | Wakimoto |

* cited by examiner

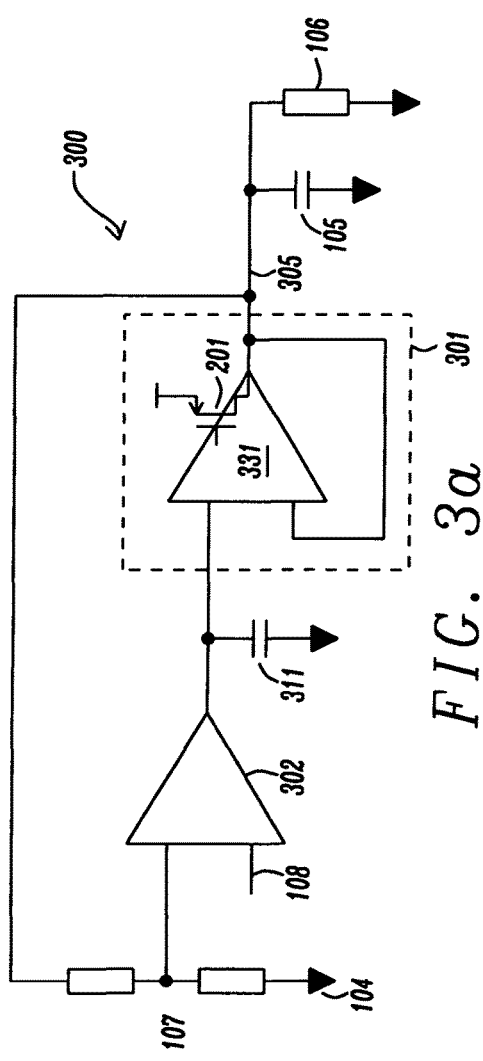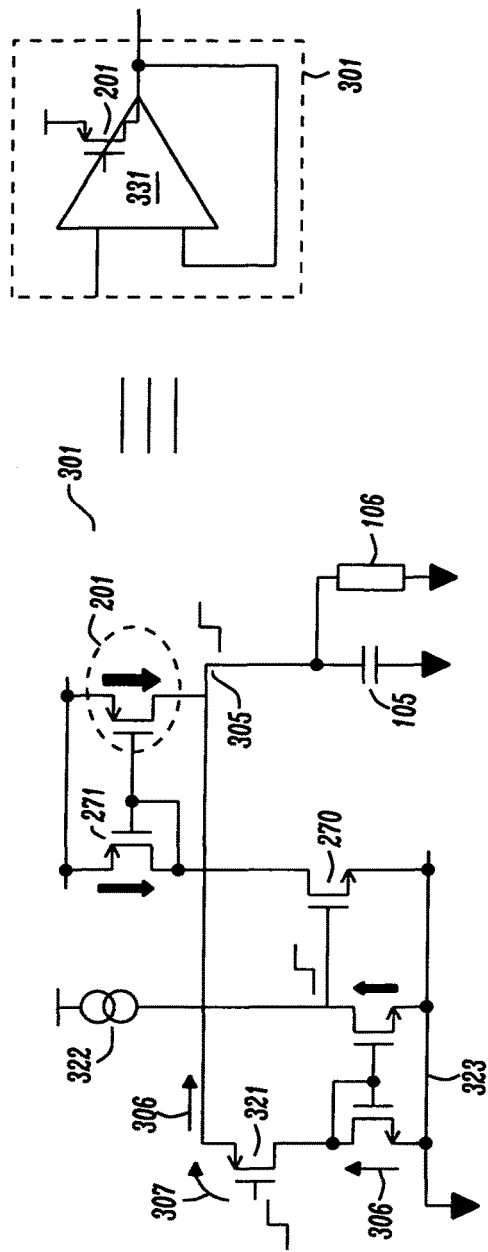
FIG. 3a
FIG. 3b

US 9,671,805 B2

LINEAR VOLTAGE REGULATOR UTILIZING A LARGE RANGE OF BYPASS-CAPACITANCE

TECHNICAL FIELD

The present document relates to amplifiers, notably multi-stage amplifiers, such as linear regulators or linear voltage regulators (e.g. low-dropout regulators) configured to provide a constant output voltage subject to load transients.

BACKGROUND

An example of multi-stage amplifiers are low-dropout (LDO) regulators which are linear voltage regulators that can operate with relatively small input-output differential voltages. A typical LDO regulator 100 is illustrated in FIG. 1a. The LDO regulator 100 comprises an output stage 103, which comprises e.g. a field-effect transistor (FET), at the output, and a differential amplification stage or a differential amplifier 101 (also referred to as an error amplifier) at the input. A first input (fb) 107 of the differential amplifier 101 receives a fraction of the output voltage $V_{out}$ determined by the voltage divider 104 comprising resistors R0 and R1. The second input (ref) to the differential amplifier 101 may be a stable voltage reference $V_{ref}$ 108 (also referred to as the bandgap reference). If the output voltage $V_{out}$ changes relative to the reference voltage $V_{ref}$, the drive voltage to the output stage, e.g. the power FET, changes by a feedback mechanism called main feedback loop to maintain a constant output voltage $V_{out}$.

The LDO regulator 100 of FIG. 1a further comprises an optional additional intermediate amplification stage 102 configured to amplify the output voltage of the differential amplification stage 101. As such, an intermediate amplification stage 102 may be used to provide an additional gain within the amplification path. Furthermore, the intermediate amplification stage 102 may provide a phase inversion.

In addition, the LDO regulator 100 may comprise an output capacitance $C_{out}$ (also referred to as an output capacitor or a stabilization capacitor or a bypass capacitor) 105 parallel to the load 106. The output capacitor 105 is used to stabilize the output voltage $V_{out}$ subject to a change of the load 106, in particular subject to a change of the load current $I_{load}$. It should be noted that typically the output current $I_{out}$ at the output of the output stage 103 corresponds to the load current $I_{load}$ through the load 106 of the regulator 100 (apart from typically minor currents through the voltage divider 104 and the output capacitance 105). Consequently, the terms output current $I_{out}$ and load current $I_{load}$ are used synonymously, if not specified otherwise.

Typically, it is desirable to provide a stable output voltage $V_{out}$, even subject to transients of the load 106. By way of example, the regulator 100 may be used to provide a stable output voltage $V_{out}$ to the processor of an electronic device (such as a smartphone). The load current $I_{load}$ may vary significantly between a sleep state and an active state of the processor, thereby varying the load 106 of the regulator 100. In order to ensure a reliable operation of the processor, the output voltage $V_{out}$ should remain stable, even in response to such load transients.

At the same time, the LDO regulator 100 should be able to react rapidly to load transients, i.e. the LDO regulator 100 should be able to rapidly provide the requested load current $I_{load}$, subject to a load transient. This means that the LDO regulator 100 should exhibit a high bandwidth.

In this context, it is desirable to allow for a stable operation of the LDO regulator 100 with a large range of bypass capacitors 105 (e.g. from 200 nF up to 100 µF). Furthermore, it is desirable to reduce the die-size of the LDO regulator 100, while at the same time ensuring a stable operation of the LDO regulator 100 in a large range of frequencies. In addition, it is desirable to provide an improved power supply rejection ratio (PSRR) of the LDO regulator 100.

SUMMARY

The present document addresses the above mentioned technical problems and describes an amplifier, notably a linear regulator, which exhibits a reduced die-size and which can be operated in a stable manner in conjunction with bypass capacitors having capacitance values within a relatively large range (e.g. from a range of 200 nF up to 100 µF). According to an aspect, an amplifier, e.g. a multi-stage amplifier, such as a linear regulator, is described. The amplifier may comprise a plurality of amplification stages. In particular, the amplifier may comprise an output stage for providing a load current at an output voltage. The load current may be provided to a load of the amplifier. It may be beneficial to maintain the output voltage at or above a predetermined fixed level, notably subject to a load transient.

In particular, the amplifier comprises a first amplification stage which is configured to provide an intermediate voltage, based on an outer feedback voltage and based on a reference voltage. The first amplification stage may comprise a differential amplification stage. The intermediate voltage may be dependent on a difference of the outer feedback voltage and the reference voltage. In particular, the intermediate voltage may increase as the outer feedback voltage drops below the reference voltage. That is, the intermediate voltage may increase as the difference of the outer feedback voltage and the reference voltage increases.

In addition, the amplifier comprises an output stage configured to provide the load current at the output voltage based on the intermediate voltage. Furthermore, the amplifier comprises an outer feedback circuit configured to derive the outer feedback voltage from the output voltage. In particular, the outer feedback voltage may be derived such that the output feedback voltage is proportional to the output voltage. The outer feedback circuit may comprise a voltage divider.

The output stage of the amplifier comprises a buffer configured circuit or a buffer circuit. The buffer configured circuit may exhibit no gain or may exhibit a gain equal to one from the small signal point of view. The buffer configured circuit may be such that the output voltage of the amplifier is based on the intermediate voltage of the first amplification stage, eventually shifted by the gate-source voltage VGS of a input transistor (e.g. of a PMOS transistor). As such, the output voltage of the amplifier may be equal to the intermediate voltage (possible shifted by a gate-source voltage of an input transistor of the buffer). In particular the buffer configured circuit (also referred to as a buffer) may be a closed loop buffer, because it may comprise a feedback mechanism for feeding back the information given by the output voltage to the input of the buffer.

The buffer may further comprise a pass device (e.g. a transistor, notably a metal oxide semiconductor, MOS, transistor). The pass device is configured to provide the load current at the output voltage based on a drive voltage. The drive voltage may be applied to a gate of the pass device, and the load current (also referred to as the output current) may correspond to a drain-source current of the pass device.

As a result of deriving the drive voltage also based on the inner feedback voltage, the output impedance of the output stage may be reduced. This leads to an increased stability of the amplifier and/or to an increased bandwidth of the amplifier. In particular, this allows the amplifier to be used with a large range of output capacitors. Furthermore, this allows the amplifier to be operated in a stable manner without the need of a Miller capacitor, thereby reducing the die-size of the amplifier.

The buffer may comprise an input transistor having a gate, a source and a drain. The input transistor may be a MOS transistor, e.g. a PMOS transistor. The gate-source voltage of the input transistor may depend on the intermediate voltage and on the inner feedback voltage. In particular, the gate-source voltage of the input transistor may depend on a difference between the intermediate voltage and the inner feedback voltage. The drive voltage may then be determined in dependence of the drain-source current of the input transistor.

As such, the input transistor may be used to combine the outer feedback (provided by the intermediate voltage) and the inner feedback (provided by the inner feedback voltage). As a result of this, the stability and/or bandwidth of the amplifier may be increased.

As indicated above, the outer feedback circuit may be configured such that the outer feedback voltage is proportional to the output voltage. Furthermore, the first amplification stage may be configured such that the intermediate voltage increases, if the outer feedback voltage drops below the reference voltage. In addition, the inner feedback voltage may be proportional to the output voltage. In particular, the inner feedback voltage may be equal to the output voltage. In such a case, the effects of a load transient on the intermediate voltage and on the inner feedback voltage may be combined or added by the input transistor. As such, the reaction speed of the amplifier to a load transient may be increased.

The input transistor may be configured to decrease the drain-source current as the gate-source voltage decreases, and vice versa. Furthermore, the buffer may comprise comparing means which are configured to compare a current derived from the drain-source current (e.g. an amplifier or attenuated drain-source current) with a reference current. The drive signal may then depend on a difference between the current derived from the drain-source current and the reference current.

In particular, the buffer may comprise a current mirror. A first side of the current mirror may be arranged in series with the input transistor. In other words, the drain-source current through the input transistor may correspond to (e.g. may be equal to) the current through the first side of the current mirror. In addition, the buffer may comprise a current source which is configured to provide the reference current and which is arranged in series with a second side of the current mirror. Hence, the reference current may be compared with an amplified/attenuated version of the drain-source current of the input transistor. This may influence the voltage level of the midpoint between the current source and the second side of the current mirror. The drive signal may depend on the voltage level of the midpoint between the current source and the second side of the current mirror.

The buffer may further comprise a drive stage which is configured to determine the drive voltage based on the voltage level of the midpoint between the current source and the second side of the current mirror. For this purpose, the drive stage may comprise a first drive stage transistor which is configured to generate a drive current, in dependence of the voltage level of the midpoint between the current source and the second side of the current mirror. In particular, a gate of the first drive stage transistor may be coupled to the midpoint between the current source and the second side of the current mirror. Furthermore, the drive stage may comprise a second drive stage transistor which is arranged in series with the first drive stage transistor and which forms a current mirror with the pass device. As a result of this, the second drive stage transistor may be configured to control the pass device using the drive current flowing through the second drive stage transistor (and through the first drive stage transistor).

As indicated above, the first amplification stage may comprise a differential amplification stage. The differential amplification stage may comprise a differential transistor pair. Furthermore, the differential amplification stage may be configured to provide the intermediate voltage (or a voltage from which the intermediate voltage is derived by one or more additional amplification stages of the amplifier) at a stage output node of the differential transistor pair. The voltage at the stage output node may be derived based on the outer feedback voltage at a first stage input node of the differential transistor pair and based on the reference voltage at a second stage input node of the differential transistor pair. The first stage input node may correspond to the gate of a first transistor of the differential transistor pair, and the second stage input node may correspond to the gate of a second transistor of the differential transistor pair. The first transistor may be coupled to the stage output node (e.g. a drain of the first transistor may be coupled to the stage output node). The second transistor may be coupled to a current feedback node of the differential pair (e.g. a drain of the second transistor may be coupled to the current feedback node).

The differential amplification stage may further comprise an active load for the differential pair. The active load comprises a diode transistor which is coupled to the current feedback node and a mirror transistor which is coupled to the stage output node. In particular, a drain of the diode transistor may be coupled to the current feedback node, and a drain of the mirror transistor may be coupled to the stage output node.

The amplifier may further comprise a current feedback network which is configured to provide a feedback current to the current feedback node. The feedback current may be determined in dependence of a voltage at the pass device and/or in dependence of the load current. By providing a feedback current, the stability of the amplifier may be increased, notably at relatively low load currents.

The current feedback network may be such that the feedback current depends on a gate-source voltage at the pass device. In particular, the current feedback network may be such that the feedback current drops as the gate-source voltage at the pass device increases and/or as the load current increases. As such, the feedback current may be removed as the load current increases. By doing this, the stabilizing feedback current may be limited to low load currents, for which the amplifier may exhibit stability issues, which can be compensated by the current feedback network.

The current feedback network may comprise a feedback transistor having a drain, a source and a gate. The feedback current may correspond to the drain-source current of the feedback transistor. The gate of the feedback transistor may be coupled to a gate of the pass device. As a result of this, the feedback current may be determined in dependence of a voltage at the pass device. Furthermore, the source of the feedback transistor may be coupled to the source of the pass device. As a result of this, the feedback current may be determined in dependence of the gate-source voltage at the pass device.

The current feedback network may comprise a feedback current generator arranged in series to the feedback transistor. The feedback current generator may be used to insert a non-linearity within the current feedback network. In particular, the feedback current generator may be used to ensure that a feedback current is only generated for relatively low load currents.

The gates of the diode transistor and the mirror transistor may be coupled with one another to form a current mirror. The gates of the diode transistor and the mirror transistor may also be coupled to the current feedback node. Furthermore, a drain of the mirror transistor may be coupled to the stage output node. In addition, a drain of the diode transistor may be coupled to the current feedback node.

According to a further aspect, a method for stabilizing an amplifier is described. The amplifier comprises a first amplification stage configured to provide an intermediate voltage, based on an outer feedback voltage and based on a reference voltage. In addition, the amplifier comprises an output stage configured to provide a load current at an output voltage based on the intermediate voltage. The output stage comprises a pass device configured to provide the load current at the output voltage based on a drive voltage. In addition, the amplifier comprises an outer feedback circuit configured to derive the outer feedback voltage from the output voltage. The method comprises providing the drive voltage based on the intermediate voltage and based on an inner feedback voltage derived from the output voltage.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein

FIG. 3a shows an example LDO regulator comprising an output buffer;

FIG. 3b shows further details of an example output buffer;

FIG. 5b shows an excerpt of the LDO regulator of FIG. 5a;

DESCRIPTION

Figure 1A:
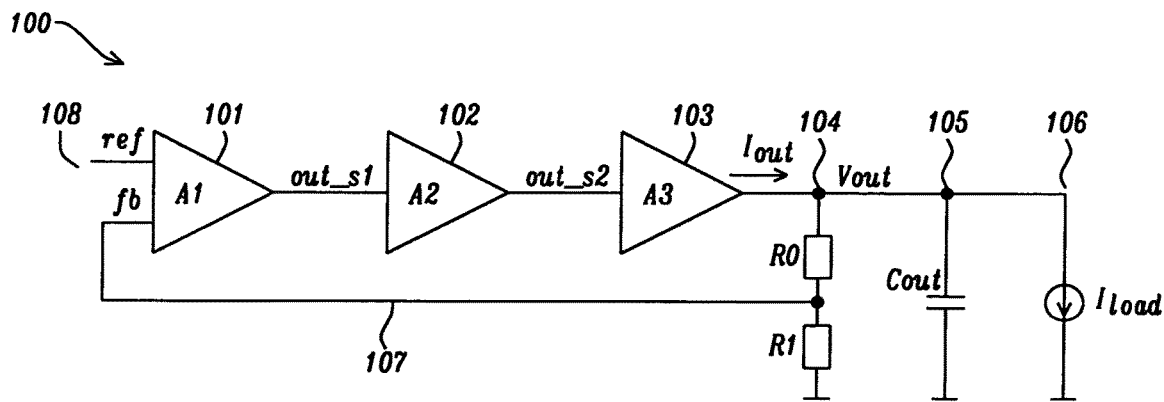
FIG. 1a illustrates an example block diagram of an LDO regulator.
Figure 1B:
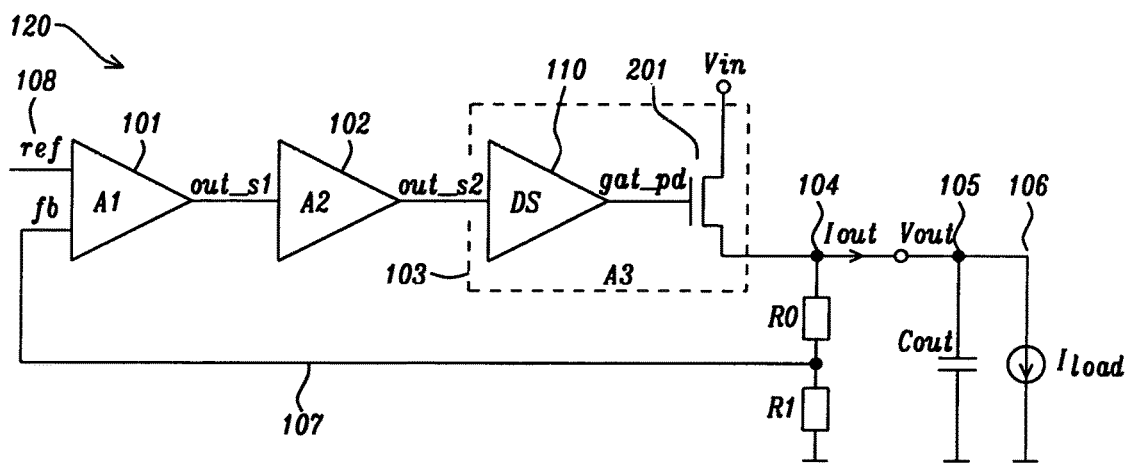
FIG. 1b illustrates the example block diagram of an LDO regulator in more detail.

As already outlined above, FIG. 1a shows an example block diagram for an LDO regulator 100 with three amplification stages A1, A2, A3 (reference numerals 101, 102, 103, respectively). FIG. 1b illustrates the block diagram of a LDO regulator 120, wherein the output stage A3 (reference numeral 103) is depicted in more detail. In particular, the pass transistor or pass device 201 and the driver stage 110 of the output stage 103 are shown. Typical parameters of an LDO regulator are a supply voltage of 3V, an output voltage of 2V, and an output current or load current ranging from 0 mA or 1 mA to 100 or 200 mA or 1 A. Other configurations are possible. The present invention is described in the context of a linear regulator. It should be noted, however, that the present invention is applicable to amplifiers, notably multi-stage amplifiers, in general.

It is desirable to provide a multi-stage amplifier such as the regulator 100, 120, which is configured to generate a stable output voltage $V_{out}$ subject to load transients. The output capacitor 105 may be used to stabilize the output voltage $V_{out}$, because in case of a load transient, an additional load current $I_{load}$ may be provided by the output capacitor 105. Furthermore, schemes such as Miller compensation and/or load current dependent compensation may be used to stabilize the output voltage $V_{out}$.

At the same time, it is desirable to provide a multi-stage amplifier with a high bandwidth. The above stabilization schemes may lead to a reduction of the speed of the multi-stage amplifier. Furthermore, the use of Miller compensation may lead to an increase of the die-size of the multi-stage amplifier. Omission of a Miller capacitor may lead to substantial reductions of the die-size of the multi-stage amplifier (e.g. 30% die-size improvement for a 300 mA LDO).

Figure 2:
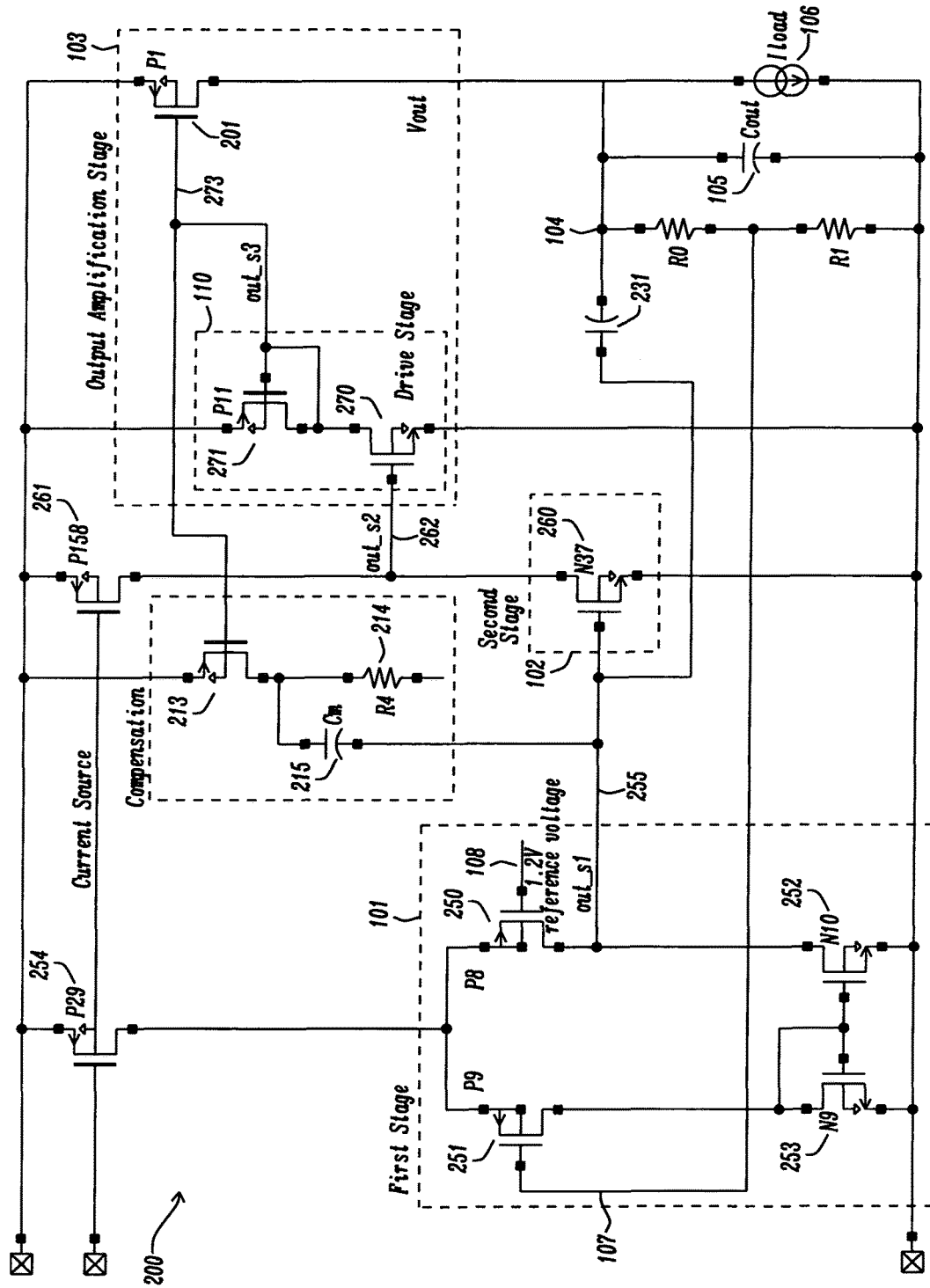
FIG. 2 shows an example circuit arrangement of an LDO regulator.

FIG. 2 illustrates an example circuit arrangement of an LDO regulator 200 comprising a Miller compensation using a capacitance $C_V$ 231 and a load current dependent compensation comprising a current mirror with transistors 201 (corresponding to the pass transistor 201) and 213, a compensation resistor 214 and a compensation capacitance $C_m$ 215. As indicated above, it is desirable to provide alternative stabilization means to Miller compensation, in order to be able to omit the capacitance $C_V$ 231, and to thereby reduce the die-size of the LDO regulator 200.

The circuit implementation of FIG. 2 can be mapped to the block diagrams in FIGS. 1a and 1b, as similar components have received the same reference numerals. In the circuit arrangement 200, the differential amplification stage 101, the intermediate amplification stage 102 and the output stage 103 are implemented using field effect transistors (FET), e.g. metal oxide semiconductor FETs (MOSFETs).

The differential amplification stage 101 comprises the differential input pair of transistors P9 251 and P8 250, and the current mirror N9 253 and N10 252. The input of the differential pair is e.g. a 1.2V reference voltage 108 at P8 and the feedback 107 at P9 which is derived from the resistive divider 104 (with e.g. R0=0.8 MΩ and R1=1.2 MΩ).

The intermediate amplification stage 102 comprises a transistor N37 260, wherein the gate of transistor N37 260 is coupled to the stage output node 255 of the differential amplification stage 101. The transistor P158 261 acts as a current source for the intermediate amplification stage 102, similar to transistor P29 254 which acts as a current source for the differential amplification stage 101.

The output stage 103 is coupled to the stage output node 262 of the intermediate amplification stage 102 and comprises a pass device or pass transistor 201 and a gate driver stage 110 for the pass device 201, wherein the gate driver stage comprises a transistor 270 and a transistor P11 271 connected as a diode. This gate driver stage has essentially no gain since it is low-ohmic through the transistor diode P11 271 which yields a resistance of $1/g_m$ (output resistance of the driver stage 110 of the output stage 103) to signal ground. The gate of the pass transistor 201 is identified in FIG. 2 with reference numeral 273.

In the present document, circuitry is described which may be used to stabilize a multi-state amplifier 100, 120, 200 without the need of a Miller capacitor 231. The described circuitry allows a stable operation of the multi-state amplifier 100, 120, 200 for a substantial range of output capacitors 105.

FIG. 3a shows a multi-stage amplifier 300 (notably an LDO regulator). The amplifier 300 comprises an input amplification stage 302 (e.g. a differential amplification stage 101 or a combination of the differential amplification stage 101 and an intermediate amplification stage 102 as illustrated in FIGS. 1a, 1b and 2). The input amplification stage 302 is coupled to an output stage 301, wherein the output stage 301 comprises an output buffer 331 and a pass device 201. The pass device 201 is part of or is embedded in the output stage 301. In the illustrated example, the output of the input amplification stage 302 is coupled to the input of the output stage 301 via a stabilizing capacitor 311. As already outlined in the context of FIGS. 1a, 1b and 2, the output voltage 305 ($V_{out}$) of the amplifier 300 is fed back to the input of the input amplification stage 302, e.g. using an output feedback loop (which comprises e.g. a voltage divider 104).

The output buffer 301 is implemented as a closed loop buffer. In particular, the output buffer 301 is configured to reduce the output impedance of the amplifier 300. As a result of this, the range of output capacitors/load capacitors 105 which may be used for the amplifier 300 may be increased, while at the same time ensuring a stable operation and/or a large bandwidth of the amplifier 300.

FIG. 3b shows details of an example output buffer 301. The output buffer 301 comprises the driver stage 110 as shown in FIG. 1b, which drives pass device 201, i.e. the transistors 270 and 271. In addition, the output buffer 301 comprises circuitry, notably an input transistor 321, a current mirror 323 and a current source 322, for reducing the output impedance at the output of the output stage 301. As a result of the additional circuitry, the pass device 201, which is embedded into the buffer 301, works as an active current generator. In this context, the error current 306 (at a first side of the current mirror 323) and the error voltage 307 (i.e. the gate-source voltage of the input transistor 321) are error signals which are reduced (e.g. minimized) by the gain of the loop which is provided by the additional circuitry 321, 322, 323.

By embedding the pass device 201 into the buffer 301, notably by embedding the pass device 201 into a negative feedback loop (which is referred to herein as an inner feedback loop), the impedance on the output node of the amplifier 300 can be reduced (instead of only reducing the impedance at the gate of the pass device 201). In particular, the buffer 301 comprising the pass device 201 affects the output impedance of the amplifier 300 (e.g. the LDO) using relatively cost effective circuitry.

Figure 3C:
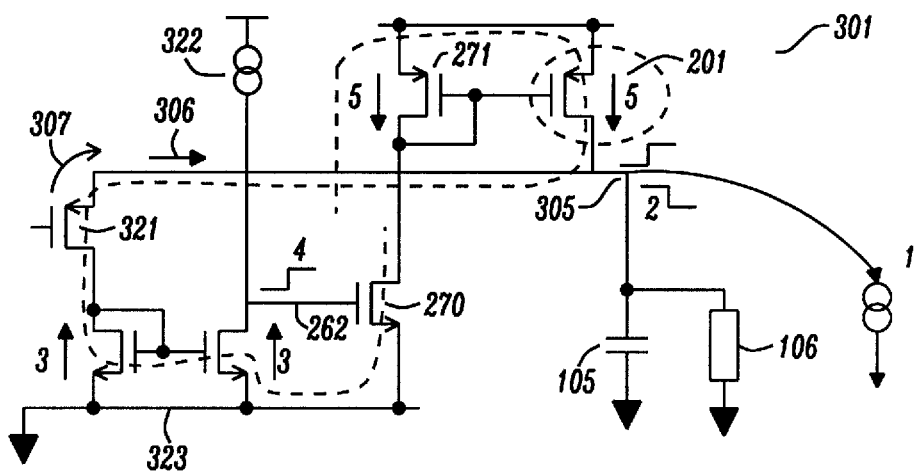
FIG. 3c illustrates the operation of the example output buffer of FIG. 3b.

The operation of the output buffer 301 is illustrated in FIG. 3c. The numbers in brackets "( )" correspond to the numbers shown in FIG. 3c. A current signal (1) affecting the output node of the amplifier 300 (i.e. the output node of the output stage 301) initially produces a voltage drop (2) of the output voltage 305. In other words, an increase of the load 106 at the output of the output stage 301 typically causes an initial drop of the output voltage 305. The drop of the output voltage 305 is sensed by the input transistor 321 of the buffer 301 (as an inner feedback voltage). As illustrated in FIG. 3c the input transistor 321 may comprise or may correspond to a PMOS transistor. The drop of the output voltage 305 may therefore be sensed by the common gate PMOS 321, which will typically produce a current variation (3) in the current mirror 323 (e.g. within the NMOS current mirror 323). In particular, the voltage drop of the output voltage 305 leads to a reduction of the error voltage 307 across the gate-source of the input transistor 321, thereby reducing the error current 306.

The reduction of the pull-down against the constant reference current provided by the current source 322 generates a positive voltage signal (4) at the second side of the current mirror 323 and at the input node 262 of the drive stage transistor 270. The input node 262 corresponds to the midpoint between the current source 322 and the second side of the current mirror 323. The reduction of the pull-down leads to an increase of the voltage level at the input node 262. This leads to an increase of the current flowing (5) through the pass device 201. This additional current flowing through the pass device 201 tends to reduce the initial variation of the output voltage $V_{out}$ 305. Hence, a reduction of the output impedance of the amplifier 300 at the pass device 201 is achieved. As a result of this, an LDO regulator 300 is provided which exhibits a large bandwidth and which may be operated in a stable manner for a wide range of output capacitors 105.

Figure 3D:
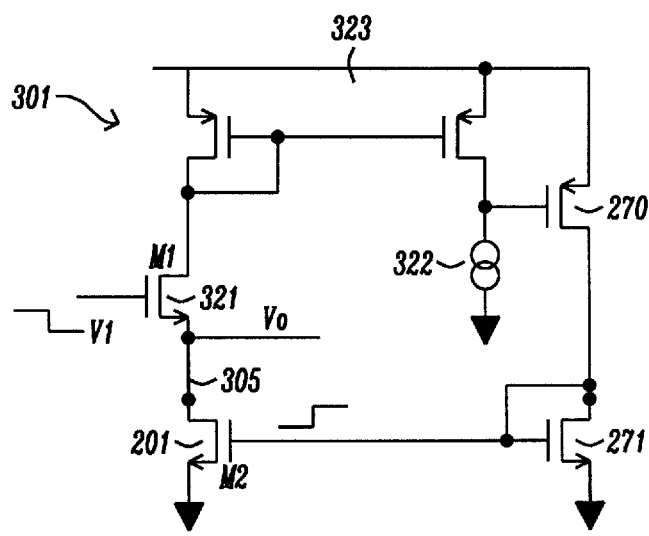
FIG. 3d illustrates an example output buffer comprising an NMOS pass device.

FIG. 3d shows a reciprocal buffer circuit (using PMOS transistors instead of NMOS transistors and vice versa) compared to the buffer circuit of FIG. 3c. Again it can be seen that the pass device 201 is part of the closed feedback loop. The pass device 201 acts as an active current generator. If the intermediate voltage V1 changes, the output voltage Vo 305 typically does not change only because of the partition between $1/g_m$ and the output resistance of the active current generator. The active current generator itself does not have a fixed $V_{GS}$, but it is part of a negative feedback. If the intermediate voltage V1 decreases, the output voltage Vo decreases. However, the negative feedback triggers the gate of the active current generator M2 201 to increase, such that the pull down of the output voltage Vo is more efficient. The output resistance of the active current generator 201 is reduced by the gain of the negative feedback loop.

Hence, as outlined in FIGS. 3a to 3d, the pass device 201 is part of the buffer loop (reflected by the dotted line in FIG. 3c). The input of the buffer 301 is typically not at the same potential of the output voltage, as there is a level shift because of the $V_{GS}$ of the input transistor 321. The buffer functionality may be as follows (from the small signal point of view): a variation on the input voltage V1 is reflected on a variation of the output voltage (ideally with a ratio equal to 1).

Figure 4:
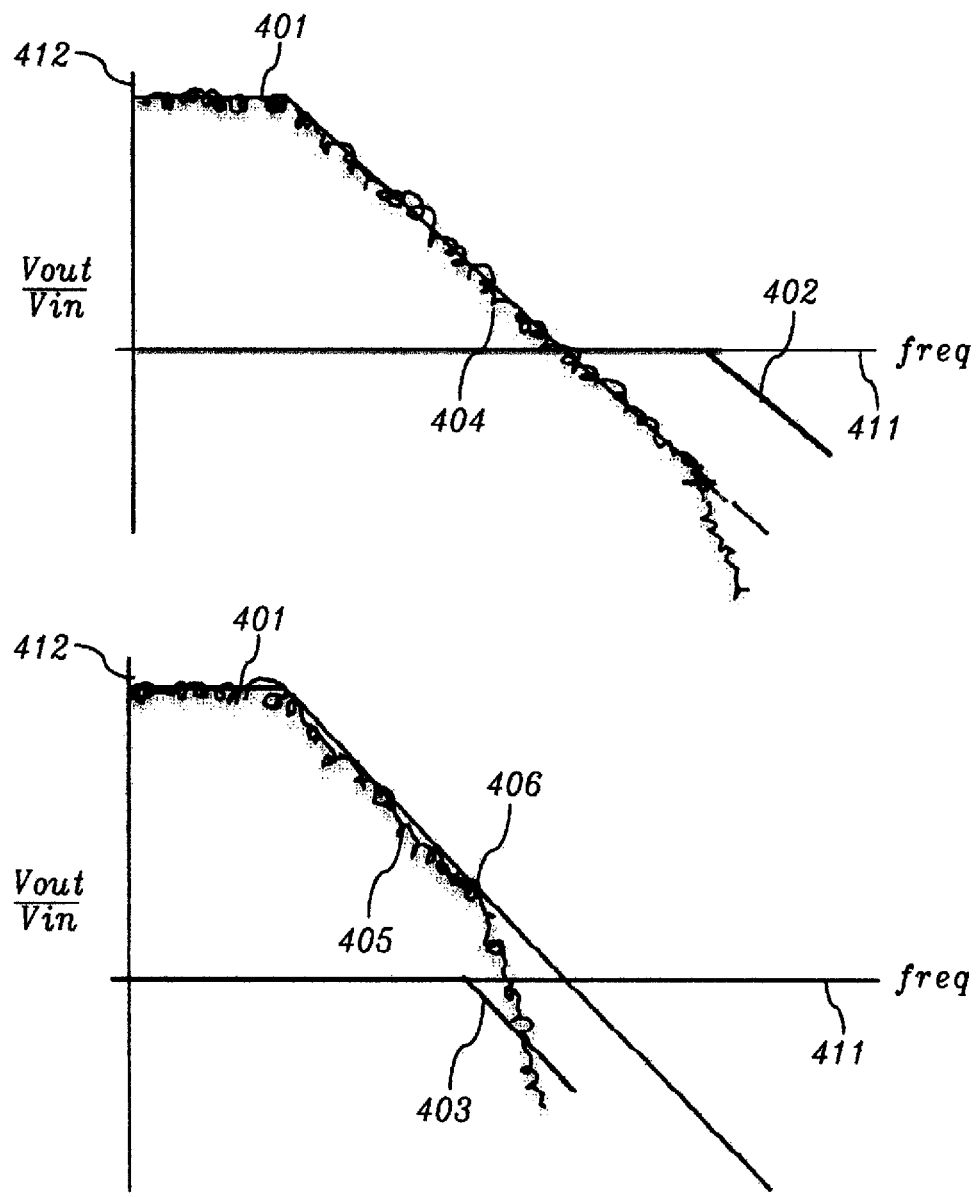
FIG. 4 shows example transfer functions of an LDO regulator comprising a buffer.

The bandwidth of the buffer 301 typically depends on the load current at the output of the amplifier 300. This is because the output resistance of the pass device 201 is typically inversely proportional to the load current Iload. As is shown in the context of FIG. 4, this may lead to stability issues of the amplifier 300 for low load current situations.

The total transfer function of the amplifier 300 may be determined as the product of the first stage 302 transfer function and the transfer function of the closed loop buffer 301, i.e. the closed loop buffer transfer function as shown in FIG. 3a. FIG. 4 shows an example transfer function 401 of the input amplification stage 302 and example transfer functions 402, 403 for the closed loop buffer 301. The total transfer function typically shows the ratio 412 of the output voltage to the input voltage of the amplifier 300 (i.e. the gain 412 of the amplifier 300), as a function of the frequency 411. The closed loop buffer transfer function 402 corresponds to a situation of a medium to high load current. It can be seen that the resulting overall transfer function 404 (hand drawn line) does not exhibit a second pole for gains 412 greater 0 dB (the 0 dB gain line corresponds to the frequency axis 411). Hence, for medium to high load currents, the amplifier 300 is stable across the complete bandwidth of the amplifier 300.

On the other hand, the bandwidth of the buffer 301 decreases for relatively low load currents (e.g. load currents close to or at zero). The resulting closed loop buffer transfer function 403 is shown in the lower diagram of FIG. 4. It can be seen that as a result of the reduced bandwidth of the closed loop buffer 301, the overall transfer function 405 (hand drawn line) of the amplifier 300 exhibits a second pole 406 for a gain 412 greater 0 dB. This may lead to instabilities of the amplifier 300.

In the present document, a current feedback network (also referred to as a gain limiter) is described, which is configured to compensate potential instabilities of the amplifier 300 at relatively low load currents.

A system having a transfer function $$\frac{Vout}{Vin} = A$$

may be provided with a negative feedback of the output voltage Vout at the output of the system back to the input voltage Vin at the input of the system, using a feedback function or feedback network β. The resulting closed loop transfer function may be given by $$\frac{Vout}{Vin} = \frac{A}{1 + A\beta}.$$

Hence, a negative feedback typically reduces the gain of the system. Furthermore, it can be seen that the zeros of the feedback function β become poles of the closed loop system, and the poles of the feedback function β become zeros of the closed loop system.

Figure 5A:
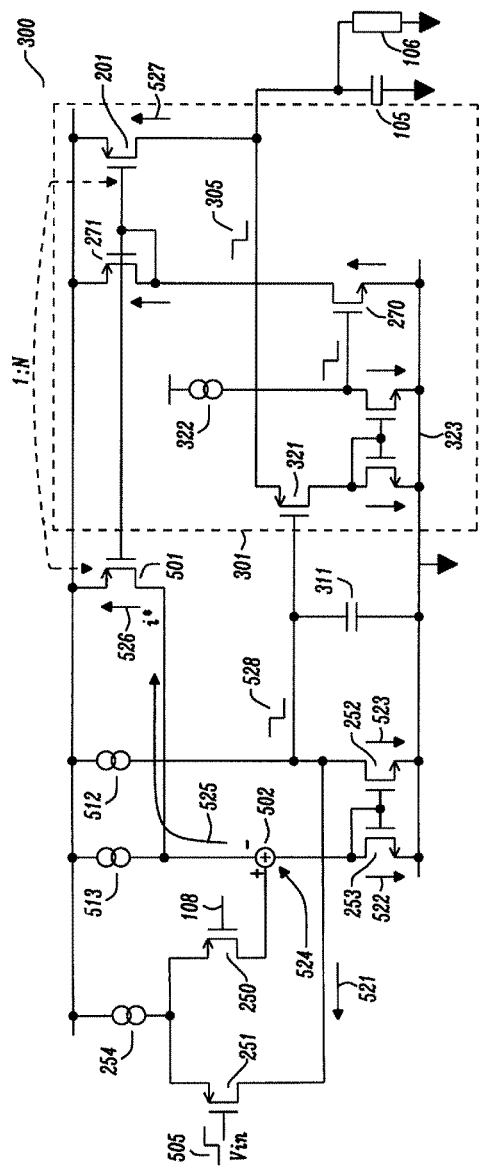
FIG. 5a shows a block diagram of an example LDO regulator comprising a current feedback network.

In view of the above, it is proposed to add a negative feedback network to the amplifier 300, in order to compensate potential instabilities of the amplifier 300 at relatively low load currents. An example feedback network is illustrated in FIG. 5a. The feedback network comprises a feedback transistor 501 which may form a current mirror with the pass device 201 of the buffer 301, and which may provide a feedback current to a current feedback node 502. The local feedback may be provided by the feedback transistor 501 and the buffer 301. This local feedback reduces the gain of the overall amplifier 300.

Figure 5B:
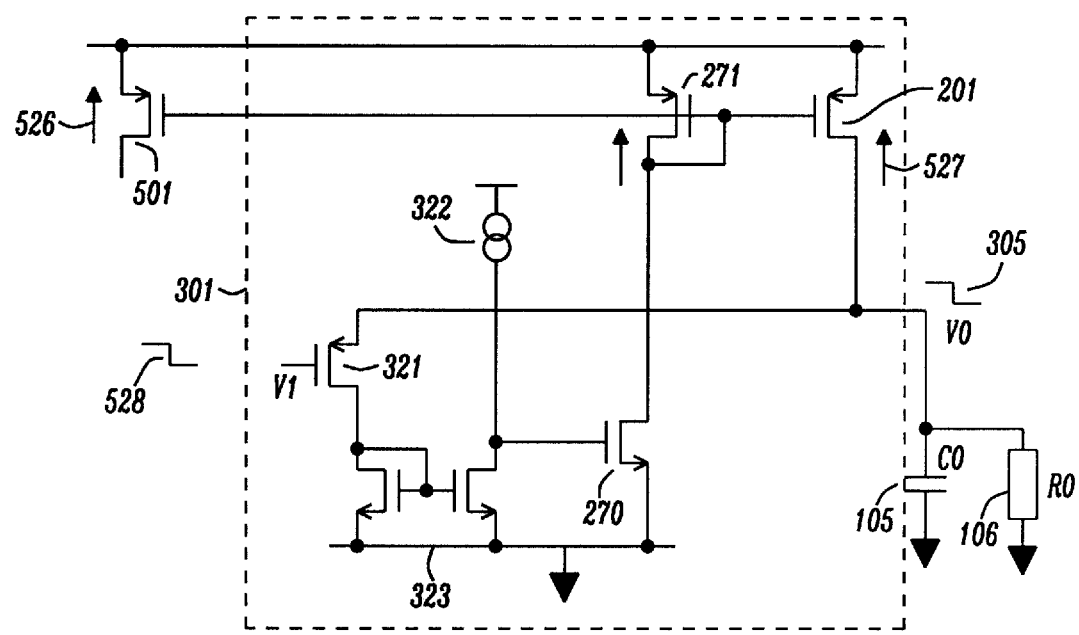

In particular, the feedback transistor 501 provides a current mode feedback. The summing node 502 (also referred to as the current feedback node) for providing the feedback is explicitly shown in FIG. 5a. In the illustrated example, the current i*, 526 is the feedback current which is provided at the output of the feedback network β. The feedback network may have as its input the voltage v1 528 as shown in FIG. 5b.

In FIG. 5a, the input voltage vin 505 at one of the differential nodes of the input amplification stage is shown. This input voltage vin 505 may correspond to the output feedback voltage 107 of FIG. 3a. The currents 521, 524 at the output nodes of the differential amplification stage (notably at the current feedback node 502) are depend on the transconductance $g_m$ of the differential amplification stage, i.e. the currents 521, 524, with $$i^*(0) = vin\frac{g_m}{2}.$$

The current 521, 524 may correspond to the current 525, 526 shown in FIG. 5a. Furthermore, FIG. 5a shows the error currents 522, 523, which are typically identical. In addition, FIG. 5a shows current sources 513, 512, which may be used to set an operation point of the differential amplification stage 302. FIG. 5b shows the feedback network with the voltage v1 528 at the input and the current i*, 526 at the output. It can be shown that the transfer function for the feedback network β is given by $$i^* \approx v1\frac{1}{N}\frac{(1 + sRoCo)}{Ro(1 + s\tau_{GBWP})},$$

wherein i* is the current 526 at the output of the feedback network, v1 is the voltage 528 at the input of the feedback network, Co is the capacitance of the output capacitor 105, Ro is the resistance of the load 106, N is the mirror ratio of the current mirror which is formed by the pass device 201 and the feedback transistor 501, and $\tau_{GBWP}$ is the pole of the buffer 301.

The overall open loop transfer function of the amplifier 300 can be determined to be $$\frac{vo}{vin(s)} \approx N\frac{g_m}{2}\frac{Ro}{(1 + sRoCo)},$$

with vo being the output voltage 305, vin being the input voltage 505, and $g_m$ being the transconductance of the differential amplification stage 302 as shown in FIG. 3a.

Figure 6:
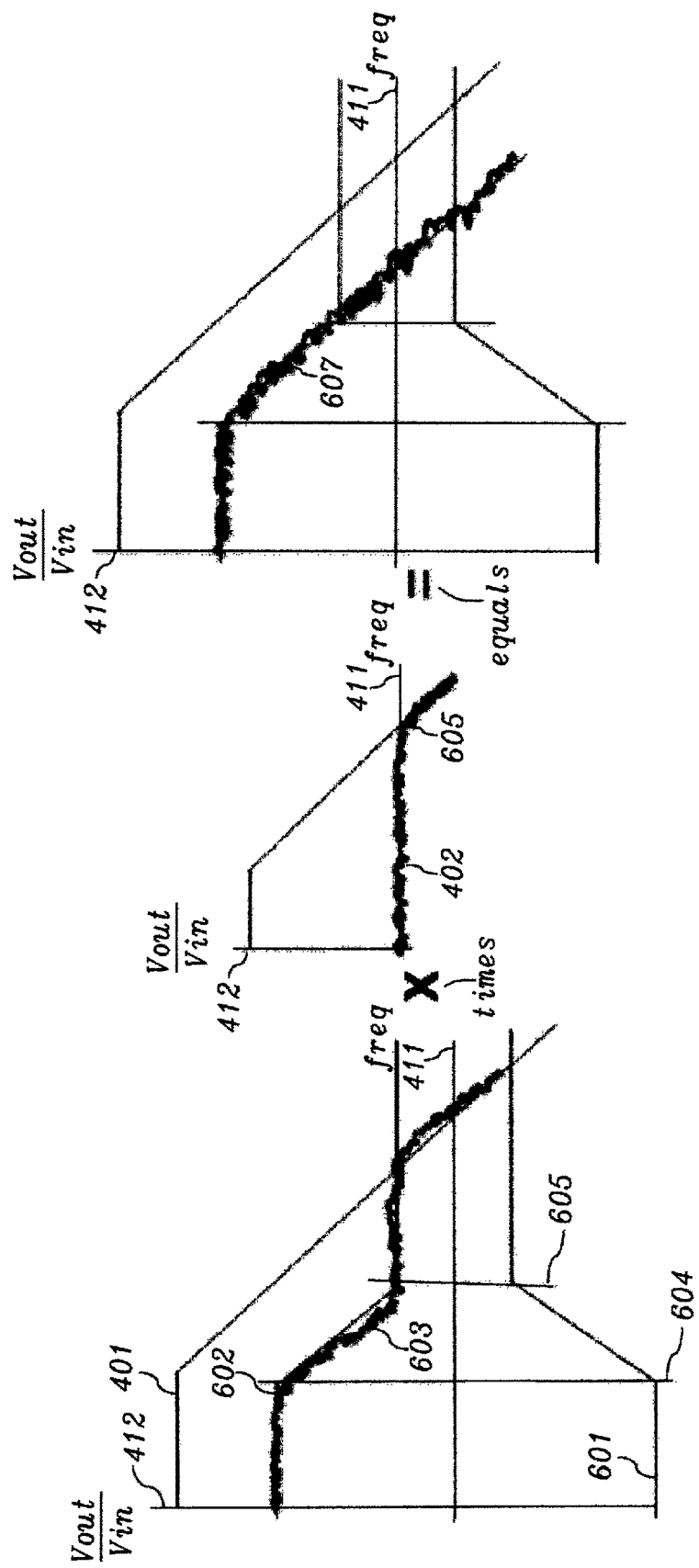
FIG. 6 shows example transfer functions of an LDO regulator comprising a current feedback network.

The transfer function 601 of the feedback network β is illustrated in FIG. 6. As can be seen from the above formula, the transfer function 601 of the feedback network β comprises a zero 604 at $$\frac{1}{RoCo}$$

and a pole 605 at $$\frac{1}{\tau_{GBWP}}.$$

The inverse transfer function 602

$$\left(\text{i.e. } \frac{1}{\beta}\right)$$

exhibits a pole 604 at $$\frac{1}{R_o C_o}$$

and a zero 605 at $$\frac{1}{\tau_{GBWP}}.$$

The resulting transfer function $$\frac{v1}{vin}$$

is illustrated as curve 603 (hand drawn line). The overall open loop transfer function $$\frac{vo}{vin}$$

of the amplifier 300 is obtained by combining the transfer function 603 with the closed loop transfer function 402 as shown in FIG. 6 of the buffer 301, thereby providing the transfer function 607. It can be seen that this transfer function 607 does not exhibit any additional poles for gains greater 0 dB. Hence, the amplifier 300 has been stabilized using the feedback network β.

As indicated above, the feedback network is typically only needed to stabilize the amplifier 300 for relatively low load currents. The open loop transfer function $$\frac{vo}{vin(s)}$$

of the amplifier depends on the factor N (which may e.g. be the mirror ratio of a current mirror formed by the pass device 201 and by the feedback transistor 501). This factor N may be referred to as a feedback factor of the current feedback network. The feedback factor may be non-linear. In particular, the feedback factor may be dependent on the level of the load current. Even more particularly, the feedback factor may tend towards infinity (N→∞) for increasing load currents. As a result of this, the gain limitation which is provided by the current feedback network may be limited to relatively low load currents.

Figures 7, 8:
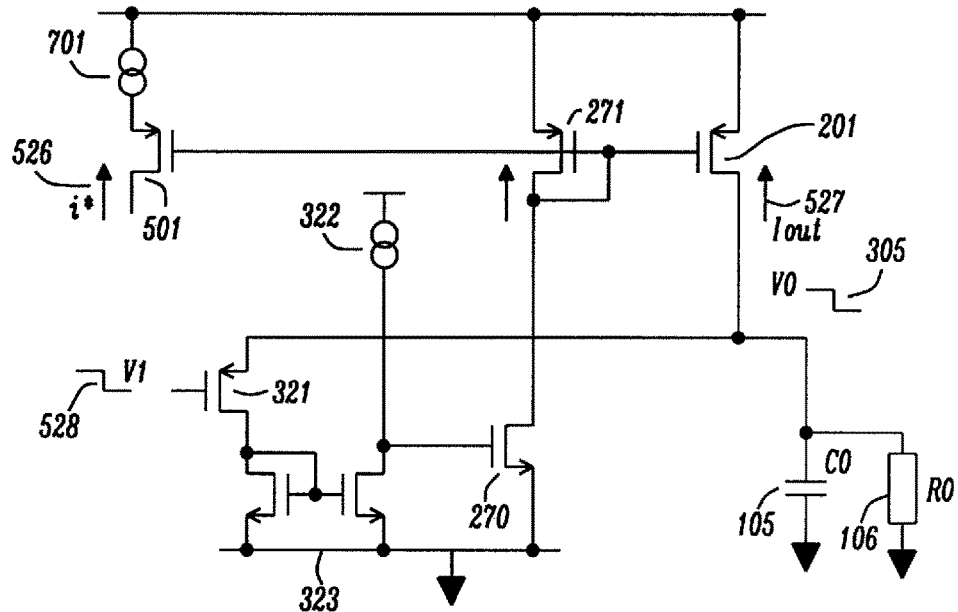
FIG. 7 shows an excerpt of an LDO regulator comprising a non-linear current feedback network.
FIG. 8 shows a flow chart of an example method for stabilizing an amplifier.

FIG. 7 shows an example of a feedback network comprising a feedback transistor 501 which is arranged in series with a feedback current generator 701. The current generator 701 may be configured to set the feedback current i*, 526 to zero for relatively high gate-source voltages Vgs at the pass device 201. Hence, the current feedback is interrupted, i.e. no signal current i*, 526 is injected to the first amplification stage 302. By consequence, the gain limiter/feedback network does not affect the amplifier 300. The current generator 701 may be selected such that the maximum current which is injected on the first amplification stage 302 produces only negligible effects on the output accuracy.

As such, the feedback current i*, 526 may be a function of the load current of the amplifier 300 and/or of the gate-source voltage at the pass device 201 of the amplifier 300. The function may be such that the feedback current i*, 526 decreases with increasing load current or gate-source voltage.

The stabilizing effect of the buffer 301 and/or of the current feedback network 501 has been confirmed in corresponding experiments.

FIG. 8 shows a flow chart of an example method 800 for stabilizing an amplifier 300 (notably without using Miller compensation, i.e. without using a Miller capacitor). The amplifier 300 comprises a first amplification stage 302 which is configured to provide an intermediate voltage 528 as shown in FIG. 5b. The intermediate voltage 528 is determined based on an outer feedback voltage 107 and based on a reference voltage 108 as shown in FIG. 3a. Furthermore, the amplifier 300 comprises an output stage 301 configured to provide a load current 527 at an output voltage 305 based on the intermediate voltage 528 as shown in FIG. 5b. The output stage 301 comprises a pass device 201 which is configured to provide the load current 527 at the output voltage 305 based on a drive voltage. In addition, the amplifier 300 comprises an outer feedback circuit 104 configured to derive the outer feedback voltage 107 from the output voltage 305 as shown in FIG. 3a. The method 800 comprises providing 801 the drive voltage (e.g. using the buffer 321 described in the present document) based on the intermediate voltage 528 and based on an inner feedback voltage derived from the output voltage 305. As a result of this, the amplifier 300 may be operated in a stable manner without the need of a Miller capacitor 231. By consequence, the die-size of the amplifier 300 may be reduced.

In the present document, circuitry for an amplifier has been described which may be used to stabilize the amplifier without the need of using a Miller capacitance. By doing this, amplifiers with a reduced die-size may be provided. The resulting amplifiers exhibit stability and high bandwidth for a large range of output capacitors (e.g. from 200 nF up to 100 µF). Furthermore, the PSRR (power supply rejection ratio) of the amplifier may be improved due to the use of load-pole compensation.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. An amplifier comprising
a first amplification stage configured to provide an intermediate voltage, based on an outer feedback voltage and based on a reference voltage;
an output stage configured to provide a load current at an output voltage based on the intermediate voltage; and
an outer feedback circuit configured to derive the outer feedback voltage from the output voltage;
wherein the output stage comprises a buffer configured to provide a drive voltage based on the intermediate voltage and based on an inner feedback voltage derived from the output voltage; and wherein the buffer comprises a pass device configured to provide the load current at the output voltage based on the drive voltage, and wherein
the first amplification stage comprises a differential amplification stage;
the differential amplification stage comprises a differential transistor pair, and is configured to provide the intermediate voltage at a stage output node of the differential transistor pair, based on the outer feedback voltage at a first stage input node and based on the reference voltage at a second stage input node;
the differential transistor pair further comprises a current feedback node;
the differential amplification stage further comprises an active load comprising a diode transistor directly coupled to the current feedback node and a mirror transistor coupled to the stage output node, wherein the current feedback node comprises a drain of the diode transistor; and
the amplifier further comprises a current feedback network configured to provide a feedback current to the current feedback node, in dependence of a voltage at the pass device.

2. The amplifier of claim 1, wherein
the buffer comprises an input transistor having a gate, a source and a drain;
a gate-source voltage of the input transistor depends on the intermediate voltage and on the inner feedback voltage; and
the drive voltage depends on a drain-source current of the input transistor.

3. The amplifier of claim 2, wherein
the outer feedback circuit is such that the outer feedback voltage is proportional to the output voltage;
the first amplification stage is such that the intermediate voltage increases if the outer feedback voltage drops below the reference voltage;
the inner feedback voltage is proportional to the output voltage; and
the gate-source voltage of the input transistor depends on a difference between the intermediate voltage and the inner feedback voltage.

4. The amplifier of claim 2, wherein
the input transistor is configured to decrease the drain-source current as the gate-source voltage decreases, and vice versa; and
the buffer comprises comparing means configured to compare a current derived from the drain-source current with a reference current; wherein the drive voltage depends on a difference between the current derived from the drain-source current and the reference current.

5. The amplifier of claim 2, wherein the buffer comprises a current mirror, wherein a first side of the current mirror is arranged in series with the input transistor; and
a current source which is configured to provide a reference current and which is arranged in series with a second side of the current mirror; wherein the drive voltage depends on a voltage level of a midpoint between the current source and the second side of the current mirror.

6. The amplifier of claim 5, wherein the buffer comprises a drive stage configured to determine the drive voltage based on the voltage level of the midpoint between the current source and the second side of the current mirror.

7. The amplifier of claim 6, wherein the drive stage comprises
a first drive stage transistor configured to generate a drive current, in dependence of the voltage level of the midpoint between the current source and the second side of the current mirror; and
a second drive stage transistor which is arranged in series with the first drive stage transistor and which forms a current mirror with the pass device.

8. The amplifier of claim 1, wherein the inner feedback voltage is equal to the output voltage.

9. The amplifier of claim 1, wherein the current feedback network is such that the feedback current depends on a gate-source voltage at the pass device.

10. The amplifier of claim 1, wherein the current feedback network is such that the feedback current drops as the gate-source voltage at the pass device increases.

11. The amplifier of claim 1, wherein
the current feedback network comprises a feedback transistor having a drain, a source and a gate;
the feedback current corresponds to the drain-source current of the feedback transistor; and
the gate of the feedback transistor is coupled to a gate of the pass device.

12. The amplifier of claim 11, wherein the current feedback network comprises a feedback current generator arranged in series to the feedback transistor.

13. The amplifier of claim 1, wherein
gates of the diode transistor and the mirror transistor are coupled with one another;
the gates of the diode transistor and the mirror transistor are coupled to the current feedback node;
a drain of the mirror transistor is coupled to the stage output node;
the differential transistor pair comprises a first transistor for the first stage input node and a second transistor for the second stage input node;
the first transistor is coupled to the stage output node; and/or
the second transistor is coupled to the current feedback node.

14. A method for stabilizing an amplifier; wherein the amplifier comprises
a first amplification stage configured to provide an intermediate voltage, based on an outer feedback voltage and based on a reference voltage;
an output stage configured to provide a load current at an output voltage based on the intermediate voltage; wherein the output stage comprises a pass device configured to provide the load current at the output voltage based on a drive voltage; and
an outer feedback circuit configured to derive the outer feedback voltage from the output voltage;
wherein the method comprises providing the drive voltage based on the intermediate voltage and based on an inner feedback voltage derived from the output voltage, and wherein the first amplification stage comprises a differential amplification stage;

the differential amplification stage comprises a differential transistor pair, and is configured to provide the intermediate voltage at a stage output node of the differential transistor pair, based on the outer feedback voltage at a first stage input node and based on the reference voltage at a second stage input node;

the differential transistor pair further comprises a current feedback node;

the differential amplification stage further comprises an active load comprising a diode transistor directly coupled to the current feedback node and a mirror transistor coupled to the stage output node, wherein the current feedback node comprises a drain of the diode transistor; and the amplifier further comprises a current feedback network configured to provide a feedback current to the current feedback node, in dependence of a voltage at the pass device.

15. The method for stabilizing an amplifier of claim 14, wherein
the buffer comprises an input transistor having a gate, a source and a drain;
a gate-source voltage of the input transistor depends on the intermediate voltage and on the inner feedback voltage; and
the drive voltage depends on a drain-source current of the input transistor.

16. The method for stabilizing an amplifier of claim 15, wherein
the outer feedback circuit is such that the outer feedback voltage is proportional to the output voltage;
the first amplification stage is such that the intermediate voltage increases if the outer feedback voltage drops below the reference voltage;
the inner feedback voltage is proportional to the output voltage; and
the gate-source voltage of the input transistor depends on a difference between the intermediate voltage and the inner feedback voltage.

17. The method for stabilizing an amplifier of claim 15, wherein
the input transistor decreases the drain-source current as the gate-source voltage decreases, and vice versa; and
the buffer comprises comparing means to compare a current derived from the drain-source current with a reference current; wherein the drive voltage depends on a difference between the current derived from the drain-source current and the reference current.

18. The method for stabilizing an amplifier of claim 15, wherein the buffer comprises
a current mirror, wherein a first side of the current mirror is arranged in series with the input transistor; and
a current source which provides a reference current and which is arranged in series with a second side of the current mirror; wherein the drive voltage depends on a voltage level of a midpoint between the current source and the second side of the current mirror.

19. The method for stabilizing an amplifier of claim 18, wherein the buffer comprises a drive stage which determines the drive voltage based on the voltage level of the midpoint between the current source and the second side of the current mirror.

20. The method for stabilizing an amplifier of claim 19, wherein the drive stage comprises:
a first drive stage transistor which generates a drive current, in dependence of the voltage level of the midpoint between the current source and the second side of the current mirror; and
a second drive stage transistor which is arranged in series with the first drive stage transistor and which forms a current mirror with the pass device.

21. The method for stabilizing an amplifier of claim 14, wherein the inner feedback voltage is equal to the output voltage.

22. The method for stabilizing an amplifier of claim 14, wherein the current feedback network is such that the feedback current depends on a gate-source voltage at the pass device.

23. The method for stabilizing an amplifier of claim 14, wherein the current feedback network is such that the feedback current drops as the gate-source voltage at the pass device increases.

24. The method for stabilizing an amplifier of claim 14, wherein
the current feedback network comprises a feedback transistor having a drain, a source and a gate;
the feedback current corresponds to the drain-source current of the feedback transistor; and
the gate of the feedback transistor is coupled to a gate of the pass device.

25. The method for stabilizing an amplifier of claim 24, wherein the current feedback network comprises a feedback current generator arranged in series to the feedback transistor.

26. The method for stabilizing an amplifier of claim 14, wherein
gates of the diode transistor and the mirror transistor are coupled with one another;
the gates of the diode transistor and the mirror transistor are coupled to the current feedback node;
a drain of the mirror transistor is coupled to the stage output node;
the differential transistor pair comprises a first transistor for the first stage input node and a second transistor for the second stage input node;
the first transistor is coupled to the stage output node; and/or
the second transistor is coupled to the current feedback node.

* * * * *